United States Patent
Oyama et al.

(10) Patent No.: US 10,537,051 B2
(45) Date of Patent: Jan. 14, 2020

(54) MOUNTING MACHINE AND MOUNTING MANAGEMENT APPARATUS

(71) Applicant: FUJI CORPORATION, Chiryu (JP)

(72) Inventors: Shigeto Oyama, Kariya (JP); Jun Iisaka, Nisshin (JP)

(73) Assignee: FUJI CORPORATION, Chiryu (JP)

( * ) Notice: Subject to any disclaimer, the term of this patent is extended or adjusted under 35 U.S.C. 154(b) by 831 days.

(21) Appl. No.: 15/023,286

(22) PCT Filed: Oct. 3, 2013

(86) PCT No.: PCT/JP2013/076981
§ 371 (c)(1),
(2) Date: Mar. 18, 2016

(87) PCT Pub. No.: WO2015/049764
PCT Pub. Date: Apr. 9, 2015

(65) Prior Publication Data
US 2016/0249498 A1 Aug. 25, 2016

(51) Int. Cl.
*H05K 13/04* (2006.01)
*H05K 13/08* (2006.01)

(52) U.S. Cl.
CPC .......... *H05K 13/046* (2013.01); *H05K 13/08* (2013.01); *H05K 13/085* (2018.08); *H05K 13/086* (2018.08)

(58) Field of Classification Search
CPC .. H05K 13/085; H05K 13/0857; H05K 13/08; H05K 13/086; H05K 13/04–0495;
(Continued)

(56) References Cited

U.S. PATENT DOCUMENTS

| | | | |
|---|---|---|---|
| 7,899,561 B2 * | 3/2011 | Maenishi | H05K 13/0853 700/28 |
| 2004/0153868 A1 * | 8/2004 | Nonaka | G05B 19/41805 714/47.2 |

(Continued)

FOREIGN PATENT DOCUMENTS

| | | |
|---|---|---|
| CN | 1281631 A | 1/2001 |
| CN | 102843902 A | 12/2012 |

(Continued)

OTHER PUBLICATIONS

Combined Chinese Office Action and Search Report dated Mar. 26, 2018 in Patent Application No. 201380080030.1 (with English language translation and English language translation of categories of cited documents), 16 pages.

(Continued)

*Primary Examiner* — Peter Dungba Vo
*Assistant Examiner* — Kaying Kue
(74) *Attorney, Agent, or Firm* — Oblon, McClelland, Maier & Neustadt, L.L.P.

(57) ABSTRACT

A mounting machine determines whether or not there is running out of a component in a mounting process based on initial order information and the number of remaining components, and when the mounting machine determines that there is running out of a component, a modified order in which the determined component is preferentially mounted is set as the mounting order. In addition, during the mounting process when a component of a subsequent mounting target in the mounting order runs out, and a component later in the mounting order than the component does not run out, the component that does not run out is previously mounted on the board. Furthermore, the initial order which is indicated by the initial order information is set in advance as an order such that a component in the plurality of components that has a higher frequency of running out than another component is preferentially mounted.

7 Claims, 5 Drawing Sheets

(58) Field of Classification Search
CPC .............. H05K 13/046; Y10T 29/5313; Y10T 29/53174; Y10T 29/53178; Y10T 29/53183; Y10T 29/35022
USPC ........................... 29/739, 740, 741, 729, 702
See application file for complete search history.

(56) References Cited

U.S. PATENT DOCUMENTS

| | | | | |
|---|---|---|---|---|
| 2006/0265865 | A1* | 11/2006 | Yoshida | H05K 13/0061 29/729 |
| 2008/0154392 | A1* | 6/2008 | Maenishi | H05K 13/0853 700/32 |
| 2009/0082881 | A1* | 3/2009 | Awata | G05B 19/41805 700/10 |
| 2012/0004759 | A1* | 1/2012 | Ishimoto | H05K 13/08 700/117 |
| 2012/0048919 | A1* | 3/2012 | Okada | H05K 13/0857 235/375 |
| 2013/0028701 | A1* | 1/2013 | Sumi | H05K 13/0417 414/806 |

FOREIGN PATENT DOCUMENTS

| | | |
|---|---|---|
| JP | 2005-353776 A | 12/2005 |
| JP | 2013-8729 | 1/2013 |
| WO | WO 00/16602 A1 | 3/2000 |

OTHER PUBLICATIONS

International Search Report dated Dec. 10, 2013 in PCT/JP2013/076981 filed Oct. 3, 2013.
Office Action dated May 7, 2018 in European Patent Application No. 13 895 092.8.
Extended Search Report dated Nov. 7, 2016 in European Patent Application No. 13895092.8.

* cited by examiner

MOUNTING MACHINE AND MOUNTING MANAGEMENT APPARATUS

TECHNICAL FIELD

The present disclosure relates to a mounting machine and a mounting management apparatus.

BACKGROUND ART

In the related art, it is known that when components are mounted by a mounting machine on a board using a head, amounting order of the components using the head is optimized. For example, PTL 1 discloses obtaining the optimized mounting order such that a sum of movement distance of the head is minimal during component mounting, and performing mounting of the components by the mounting machine according to a production program in which the mounting order is written.

CITATION LIST

Patent Literature

PTL 1: JP-A-2005-353776

SUMMARY

Technical Problem

Here, when a component runs out during a mounting process, since it is necessary to replenish the component, there is a case where process time is increased due to amounting process being suspended at that time. However, in optimization of the mounting order in PTL 1, a case is not considered in which the component runs out in this manner.

The present disclosure is carried out in order to solve such a problem, and the main object is to further suppress an increase in mounting time due to running out of a component.

Solution to Problem

A mounting machine of the present disclosure mounts a plurality of components on a board using a mounting head, the mounting machine including mounting control device which acquires amounting order in which a component in the plurality of components that has a higher possibility of running out than another component is preferentially mounted, performs a mounting process which controls the mounting head such that the components are sequentially mounted on the board based on the acquired mounting order, and during the mounting process, when a component of a subsequent mounting target in the mounting order runs out and a component the mounting order of which is later than the component does not run out, controls the mounting head such that the component that does not run out is previously mounted on the board.

In the mounting machine of the present disclosure, during the mounting process, when a component of a subsequent mounting target in the mounting order runs out and a component later in the mounting order does not run out, the component that does not run out is mounted previously on the board. By doing this, while the component that runs out is replenished, it is possible that mounting of the other component later in the mounting order is carried out in parallel, and it is possible to further suppress an increase in mounting time due to running out of the component. Moreover, the mounting machine of the present disclosure acquires the mounting order in which a component in the plurality of components that has a higher possibility of running out than another component is preferentially mounted, and performs the mounting process based on the mounting order. By performing the mounting process in such a mounting order, running out of a component is likely to occur at an early stage of the mounting order in comparison to a case in which the mounting process is performed based on the mounting order in which the component that has a higher possibility of running out is not preferentially mounted. In other words, when running out of a component occurs, a state in which another component later in the mounting order than the component of running out still remains is likely to occur. For this reason, when running out of a component occurs, it is easy for the replenishment of the component which has run out and mounting of the other components in parallel, and it is possible to further suppress the increase in mounting time due to running out of the component. In a state in which no other component which is mountable when running out of a component occurs, the mounting time tends to increase because the mounting process is suspended until the component is replenished, but the increase of the mounting time is further suppressed because the mounting machine of the present disclosure suppresses such a state to occur. Here, "component that has a higher possibility of running out than another component" includes a component that has a higher frequency of occurrence of running out than another component, and a component in which it is determined that running out of the component occurs during the mounting process based on the number of remaining components. In addition, a mounting control device may acquire the mounting order from a storage device of the mounting machine, may acquire the mounting order that is generated in the mounting machine, and may acquire the mounting order from an external apparatus.

In the mounting machine of the present disclosure, the mounting control device may acquire an initial order which is set in advance as an order such that a component in the plurality of components that has a higher frequency of occurrence of running out than another component is preferentially mounted as the mounting order. If such a mounting order (initial order) is set in advance, it is possible to obtain the effect described above of further suppressing the increase of the mounting time due to running out of a component just by performing the mounting process according to the mounting order. Here, the initial order may be set as an order that is optimized in advance such that time that is necessary for the mounting process is shortened in consideration of an element which relates to time that is necessary for the mounting process. By doing so, it is possible to further shorten the mounting time. Elements other than running out of a component may be considered as the element which relates to time that is necessary for the mounting process. For example, movement distance (movement time) of the mounting head and the like is given as an element other than running out of a component. In addition, a component where the number of components to be mounted on the board is large, or a component where the number of components a component accommodation section of which mounted on the mounting machine is able to accommodate is small, is set as the component that has a higher frequency of running out.

The mounting machine of the present disclosure may further include mounting order setting device which determines whether or not there is a component which runs out within the initial order that does not consider the possibility of running out of the component based on the number of necessary components and the number of remaining components which are included in the initial order, and when it is determined that there is a component that runs out, sets the mounting order in which a determined component is preferentially mounted, and when the mounting order setting device sets the mounting order, the mounting control device may acquire the set mounting order and perform the mounting process based on the acquired mounting order. By doing so, when a component runs out, since the mounting process is performed based on the mounting order in which the component is preferentially mounted, it is possible to cause running out of the component to occur at an earlier stage. For this reason, even without considering the possibility that the component runs out in the initial order, it is possible to obtain the effect described above that the increase of the mounting time due to running out of the component is further suppressed. In this case, the mounting order setting device may set the mounting order by rearranging the initial order such that a component which is determined to run out is preferentially mounted.

The mounting machine of the present disclosure may further include mounting order setting device which determines whether or not there is a component that runs out in the mounting process based on the remaining number of components, and when it is determined that there is a component that runs out, sets the mounting order in which the determined component is preferentially mounted, and when the mounting order setting device sets the mounting order, the mounting control device may acquire the set mounting order and perform the mounting process based on the acquired mounting order. By doing so, when a component runs out, since the mounting process is performed based on the mounting order in which the component is preferentially mounted, it is possible to cause running out of the component to occur at an earlier stage. For this reason, mounting of the other later components in the mounting order tends to be carried out in parallel even if the component runs out, and it is possible to further suppress the increase in the mounting time. In this case, the mounting order setting device may perform determination of whether or not there is running out of a component in the mounting process based on the number of necessary components in the mounting process and the number of remaining components. The number of necessary components in the mounting process may be derived based on the initial order, and may be derived based on the mounting order which is set before.

The mounting machine of the present disclosure may further include order memory device which stores a plurality of orders which include an initial order and a preferential order in which a specific component is preferentially mounted, and mounting order setting device which determines whether or not there is running out of a component during the initial order based on the number of necessary components and the number of remaining components which are included in the initial order, and sets the preferential order as the mounting order when it is determined that there is running out of a component and the preferential order in which the component is preferentially mounted is stored in the order memory device, and when the mounting order setting device sets the mounting order, the mounting control device may acquire the set mounting order and perform the mounting process based on the acquired mounting order. By doing so, when it is determined that there is running out of a component and the preferential order in which the component is preferentially mounted is stored in advance, just the preferential order may be set in the mounting order. For this reason, it is possible to more efficiently set the mounting order in comparison to a case in which a new mounting order is generated after the determination that the component has run out. Here, the preferential order may rearrange the initial order such that the specific component is preferentially mounted.

In this case, the initial order and the preferential order may be set as orders in which time is optimized in advance to be short by considering the element which relates to the time that is necessary for the mounting process. By doing so, it is possible to further shorten the mounting time.

The mounting machine of the present disclosure may include initial order generation device which generates the initial order that is an order such that a component in the plurality of components that has a higher frequency of occurrence of running out than another component is preferentially mounted. In addition, the initial order generation device may generate the preferential order based on the initial order.

A mounting management apparatus of the present disclosure manages a mounting order of a mounting machine that performs a mounting process in which a plurality of components are mounted on a board, the mounting management apparatus including output device which acquires the mounting order in which a component in the plurality of components that has a higher possibility of running out than another component is preferentially mounted.

In the mounting management apparatus of the present disclosure, the mounting order in which a component in the plurality of components that has a higher possibility of running out than another component is preferentially mounted is output. For this reason, running out of a component is likely to occur at an early stage in the mounting process due to the mounting process being performed by the mounting machine based on the output mounting order. Accordingly, as long as the mounting machine carries out mounting of the other later components in the mounting order previously when the component runs out in the manner of the mounting machine of the present disclosure, it is possible to obtain the effect described above that it is possible to further suppress the increase in mounting time due to running out of the component. Here, in the mounting management apparatus, various aspects of the mounting machine of the present disclosure described above may be adopted, or a configuration may be added such that each function of the mounting machine of the present disclosure described above is realized. For example, the mounting management apparatus of the present disclosure may be provided with the same configuration as the order memory device which stores the initial order and the preferential order described above, and may be provided with the same configuration as the mounting order setting device described above. In addition, the output device may acquire the order which is stored in the order memory device as the mounting order and output the acquired mounting order. Alternatively, the output device may acquire the set mounting order and output the acquired mounting order when the mounting order setting device sets the mounting order. In addition, the mounting management apparatus of the present disclosure may be provided with the initial order generation device described above.

DESCRIPTION OF EMBODIMENTS

Figure 1:
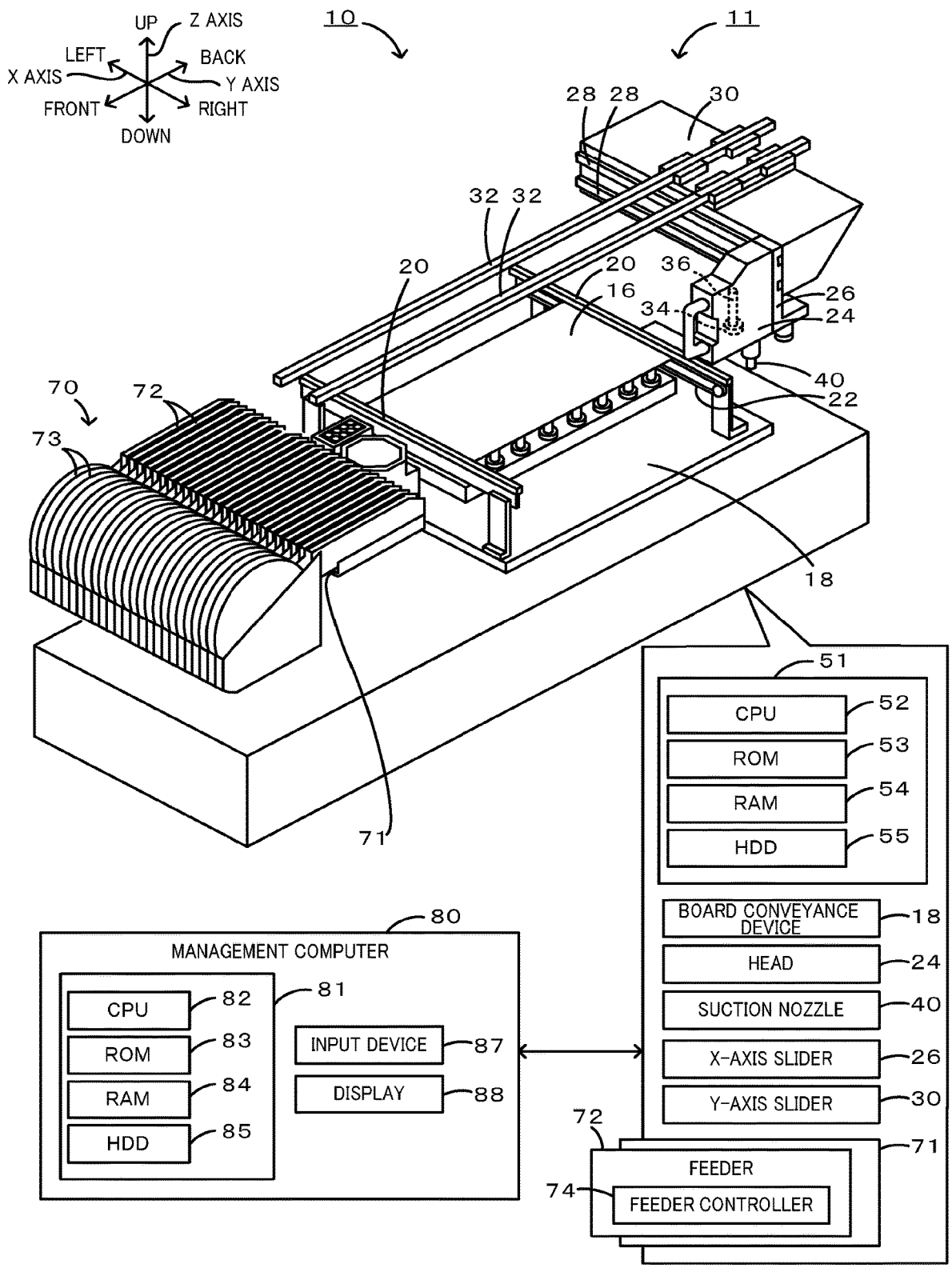
FIG. 1 is a configuration diagram illustrating an outline configuration of a component mounting system 10.

Next, embodiments of the present disclosure will be described below with reference to the drawings. FIG. 1 is a configuration diagram illustrating an outline configuration of a component mounting system 10 which is one embodiment of the present disclosure. The component mounting system 10 is provided with a mounting machine 11 and a management computer 80 which is connected to the mounting machine 11, and is configured as a mounting line which transports a board 16 and mounts various electronic components (hereinafter referred to as "components") on the board 16. In FIG. 1, the component mounting system 10 is provided with one mounting machine 11, but may be provided with a further mounting machine 11. Here, in the present embodiment, a left and right direction (X axis), a front and back direction (Y axis), and an up and down direction (Z axis) are as indicated in FIG. 1. In addition, "mounting" includes disposing, mounting, inserting, joining, adhering, and the like the component on the board 16.

Figure 2:
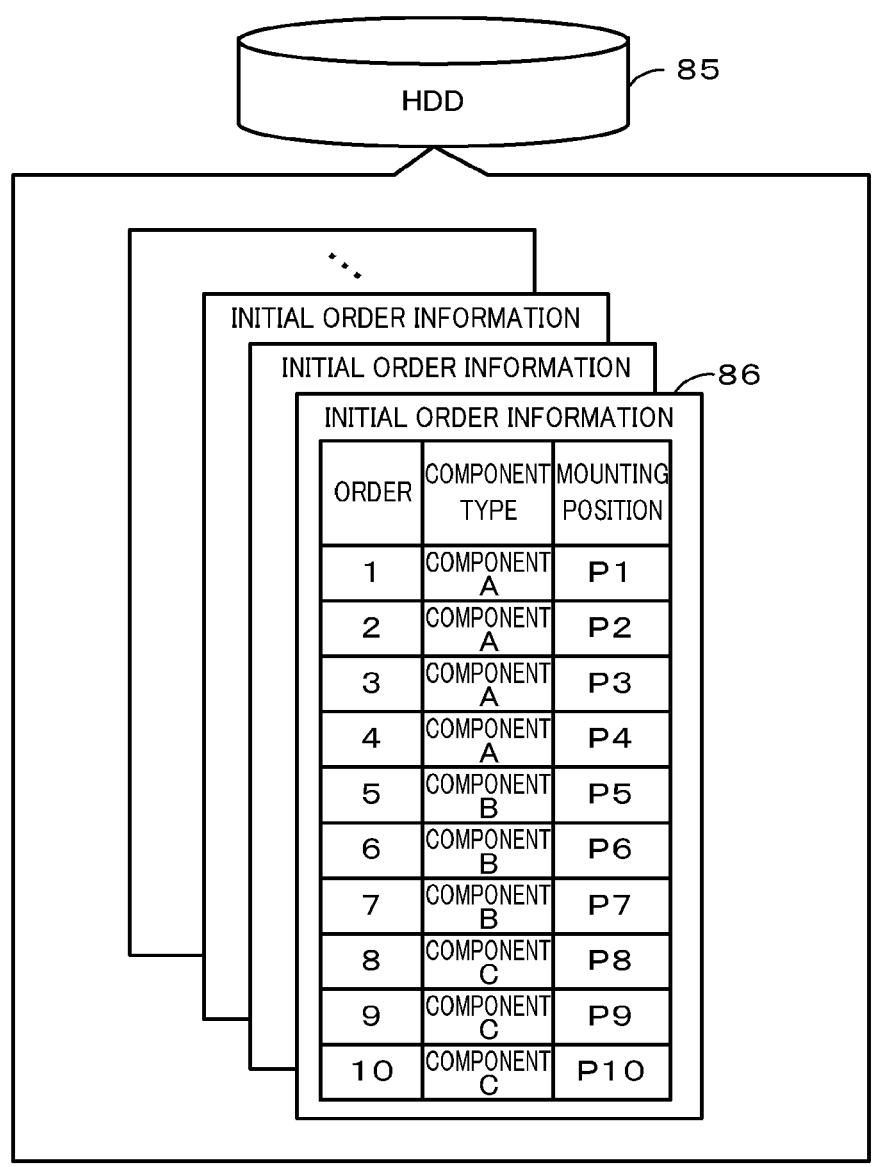
FIG. 2 is an explanatory diagram of initial order information which is stored in an HDD 85 of a management computer 80.

The mounting machine 11 is provided with a board conveyance device 18 which transports the board 16, a head 24 which is movable on an XY horizontal plane, a suction nozzle 40 which is movable in a Z axis and which is attached to the head 24, a component supply device 70 which supplies components, and a mounting controller 51 which executes various controls. The board conveyance device 18 transports the board 16 from left to right using conveyor belts 22 and 22 (only one side is illustrated in FIG. 2) which are respectively attached to a left and right pair of supporting boards 20 and 20. The head 24 moves in the left and right direction accompanying movement of an X-axis slider 26 in the left and right direction along guide rails 28 and 28, and moves in the front and back direction accompanying movement of a Y-axis slider 30 in the front and back direction along guide rails 32 and 32. The suction nozzle 40 sucks a component to the leading end of the nozzle utilizing pressure, and releases the component which is sucked by the nozzle leading end. The suction nozzle 40 adjusts a height using a Z-axis motor 34 which is built-in to the head 24 and a ball screw 36 extending along the Z axis.

The component supply device 70 has a plurality of slots 71 which are arranged in the left and right direction, and a feeder 72 is able to be inserted into each slot 71. A reel 73 around which a tape is wound is attached to the feeder 72. The plurality of components are held on a front surface of the tape in a state of being lined up at equal intervals along a longitudinal direction of the tape. A feeder controller 74 is built-in to the feeder 72. The feeder controller 74 is connected to be able to communicate in both directions with the mounting controller 51 via a connector which is not shown in the drawings. The plurality of components which are held on the tape are sequentially fed to a pick-up position at which the components can be sucked by the suction nozzle 40 due to the feeder controller 74 rotating the reel 73.

The mounting controller 51 is a microprocessor mainly configured of a CPU 52, is provided with a ROM 53 which stores a process program, a RAM 54 which is used as a work region, an HDD 55 which stores various data, and the like, and these are connected by a bus. The mounting controller 51 is connected to the board conveyance device 18, the head 24, the X-axis slider 26, the Y-axis slider 30, and the feeder controller 74 so as to be able to exchange signals.

The management computer 80 is provided with a management controller 81, an input device 87, and a display 88. The management controller 81 is a microprocessor mainly configured of a CPU 82, is provided with a ROM 83 which stores a process program, a RAM 84 which is used as a work region, an HDD 85 which stores various data, and the like, and these are connected by a bus. In addition, the management controller 81 inputs a signal from the input device 87 which includes a mouse or a keyboard, and outputs various images on the display 88. The management computer 80 manages the remaining number of components of each reel 73 of the plurality of feeders 72 which are mounted on the mounting machine 11, and stores in the HDD 85. The management computer 80 manages the number of remaining components of each reel 73 by, for example, subtracting the number of components which are used by the mounting machine 11 from the initial value (accommodatable number) of the number of components which are accommodated in the reel 73. In addition, the order in which the components are mounted on the board 16, the type of component, and the initial order information which indicates the initial order in association with the mounting position on the board 16 and the like are included on the HDD 85 of the management computer 80.

FIG. 2 is an explanatory diagram of initial order information which is stored in an HDD 85. As shown in FIG. 2, a plurality of sets of initial order information which includes initial order information 86 is stored in the HDD 85. The plurality of sets of initial order information is divided into a plurality of timings at which the order of a series of components which is mounted on the board 16 is demarcated. Accordingly, the mounting process also sets an order of mounting processes that are performed previously based on which sets of initial order information is used out of the plurality of sets of initial order information, and the order is also stored on the HDD 85. Here, the demarcated timing is a timing at which it is not possible to perform mounting of the subsequent component until all of the mounting processes up to that point are completed (alternatively, the mounting time is significantly increased if the mounting of the subsequent component is performed previously). For example, the demarcation timing is a timing at which it is necessary to exchange the suction nozzle 40 (nozzle switching) according to the component, or a timing at which mounting of the component at a lower side is completed in a case where the components on the board 16 are mounted so as to overlap up and down.

The initial order information 86 which is one of such a plurality of sets of initial order information will be described below. In the initial order information 86, the order is set in which four components A are initially mounted (Order 1 to Order 4), three components B are subsequently mounted (Order 5 to Order 7), and three components C (Order 8 to Order 10) are finally mounted, and each order is associated with the component type, the mounting position (position P1 to position P10), or the like. Order 1 to Order 10 in the initial order information 86 is set in advance as an order such that the component in the plurality of components (components A to C) which are included in the initial order information

86 that has a higher frequency of occurrence of running out than another component is preferentially mounted. In the present embodiment, the order is set such that the component is preferentially mounted with a low number of components which are able to be accommodated by the reel 73 of the feeder 72 (the number of accommodated components in each reel 73) which is mounted on the mounting machine 11. In the present embodiment, the number of components in each reel 73 has a relationship of component A<component B<component C. For this reason, in the order of component A, component B, and component C, the components are likely to run out (a cycle until the components run out is short), therefore Order 1 to Order 10 of the initial order information are set as the order such that the components are preferentially mounted in this order. In addition, the initial order information 86 may be optimized in advance such that time that is necessary for the mounting process is shortened in consideration of an element which relates to time that is necessary for the mounting process. In the present embodiment, the order of the initial order information 86 is optimized such that the movement distance of the head 24 is shortened when the ten components, which are included in the initial order information 86, are mounted on the board 16. However, optimization is performed within the range that satisfies the condition of "setting an order such that the components in the plurality of components that have a higher frequency of occurrence of running out than other components are preferentially mounted". For example, a condition such that Orders 1 to 4 are component A, Orders 5 to 7 are component B, and Orders 8 to 10 are component C is satisfied, and the order of the initial order information 86 is optimized such that the movement distance of the head 24 is shortened by modifying the disposition order of component A in Orders 1 to 4, and modifying the order of lining up between components with the same type of component.

Figure 3:
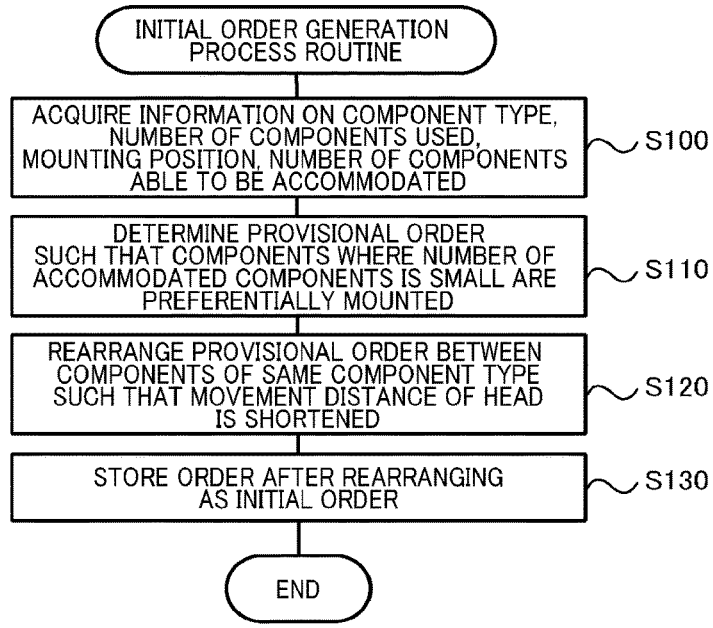
FIG. 3 is a flow chart illustrating an example of an initial order generation process routine.

Here, such an initial order is, for example, generated in advance by the management computer 80 and stored in the HDD 85. FIG. 3 is a flowchart illustrating an example of an initial order generation process routine which is executed by the CPU 82 of the management computer 80. For example, the routine is executed when a start instruction is input or the like by an operator. When the routine is started, first, the CPU 82 of the management computer 80 acquires information on the component type, the number of components to be used in each component type, the mounting position of each component, the number of each components which is able to be accommodated, and the like of the plurality of components which are to be mounted during the timing demarcated above (step S100). The CPU 82 reads and acquires information which is stored in the HDD 85 in advance, and inputs and acquires the information from an external apparatus. Subsequently, the CPU 82 determines a provisional order of each component by determining the order of each component such that the components where the number of accommodated components is small are preferentially mounted based on the acquired information (step S110). For example, in a case where there are three types of components, component A to component C, which are acquired in step S100, the number of accommodated components in each reel 73 as described above is component A<component B<component C. For this reason, the CPU 82 determines the provisional order such that all components A are mounted first as a top priority, all components B are subsequently mounted, and all components C are finally mounted. Then, the CPU 82 rearranges the provisional order between components of the same component type such that the movement distance of the head 24 is shortened based on the mounting position of each component (step S120). Thereby, the order after rearranging is an order which is optimized such that the time that is necessary for the mounting process is shortened within a range satisfying the condition of "setting an order such that the components in the plurality of components that have a higher frequency of occurrence of running out than other components are preferentially mounted". Then, after rearranging, the CPU 82 stores the order in the HDD 85 as the initial order (step S130), and the present routine ends. By doing this, the initial order information is stored in the HDD 85.

Figure 4:
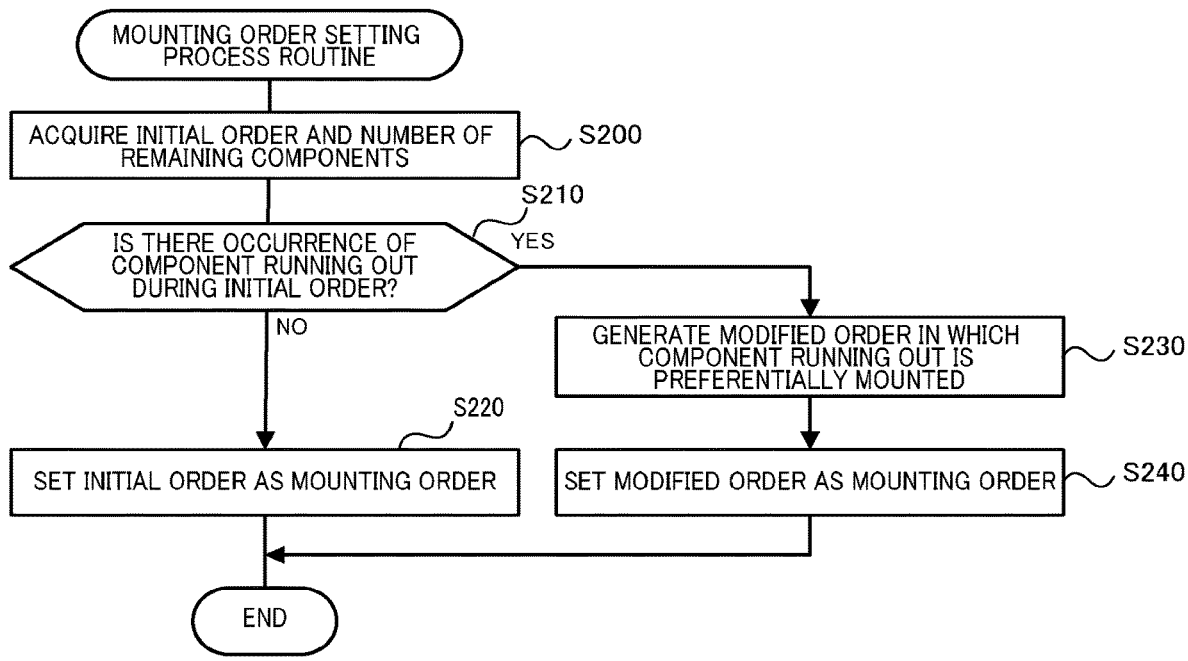
FIG. 4 is a flow chart illustrating an example of a mounting order setting process routine.

Next, the operation of the component mounting system 10 of the present embodiment which is configured in such a manner, in particular, a mounting order setting process in which the mounting machine 11 sets the mounting order based on the initial order information 86, and the mounting process in which the plurality of components are mounted on the board 16 based on the set mounting order will be described. First, the mounting order setting process which is performed by the mounting machine 11 will be described. FIG. 4 is a flow chart illustrating an example of a mounting order setting process routine which is executed by the CPU 52 of the mounting controller 51. The routine is stored in the HDD 55 of the mounting machine 11, and for example, is executed when a start instruction is input by an operator, when the board 16 is transported to a predetermined board processing position by the board conveyance device 18, or the like.

When the routine is started, first, the CPU 52 of the mounting controller 51 acquires the initial order information which indicates the initial order and the number of remaining components which are to be used in the initial order (step S200). The initial order information and the number of remaining components are acquired by the CPU 52 from the management computer 80, and stored in the HDD 55. When there is a request from the CPU 52, the CPU 82 of the management computer 80 outputs one out of the plurality of sets of initial order information which is stored in the HDD 85 and the number of remaining components of each type of component which is included in the initial order information to the mounting machine 11. Here, as described above, since each order is set in the plurality of sets of initial order information, the CPU 82 outputs the initial order information which corresponds to the mounting processes which are subsequently performed according to the order to the mounting machine 11.

Next, the CPU 52 determines whether or not there is an occurrence of running out of a component during the acquired initial order based on the acquired initial order information and the number of remaining components (step S210). In detail, the CPU 52 calculates the number of necessary components which are included in the initial order information for each type of component, and in a case where the calculated number of necessary components is greater than the number of remaining components, it is determined whether or not the components run out (component insufficiency) during the initial order. Here, the CPU 52 also determines that the components run out in a case where the acquired number of remaining components is already zero. In step S210, CPU 52 determines that the components do not run out, the CPU 52 sets the initial order which is indicated by the acquired initial order information to the mounting order using the current mounting process without change (step S220), and the present routine ends.

Meanwhile, in step S210, when the CPU 52 determines that the component runs out, a modified order in which the component which runs out is preferentially mounted is generated (step S230). The modified order is generated by the CPU 52 by rearranging the initial order which is acquired in step S200. In the present embodiment, the CPU 52 generates the modified order by rearranging the initial order which is acquired in step S200 such that the order of the component which runs out is previous to any other component. That is, the modified order is generated as an order such that the component which runs out is mounted as a top priority. Here, the CPU 52 stores the generated modified order in the HDD 55 as post-modification order information. Then, the CPU 52 sets the generatedmodified order to the mounting order which is used in the current mounting process (step S240), and the present routine ends.

Figure 5:
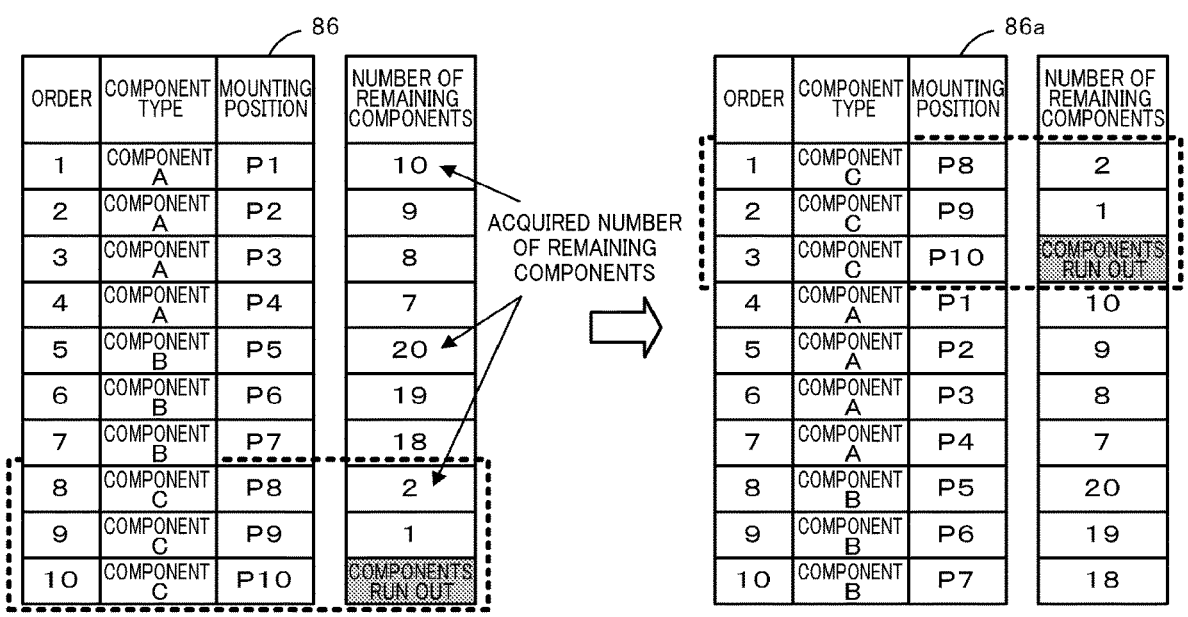
FIG. 5 is an explanatory diagram illustrating an aspect of performing the mounting order setting process.

Here, an aspect of performing a mounting setting process will be described as an example of a case where the initial order information 86 which is shown in FIG. 2 is acquired by the CPU 52 in step S200. FIG. 5 is an explanatory diagram illustrating the aspect of performing the mounting order setting process. In FIG. 5, the initial order information 86 is indicated on the left side, and modified order information 86a which is generated based on the initial order information 86 is indicated on the right side. In step S200, the CPU 52 acquires the initial order information 86 and the number of remaining components of component A to component C which are included in the initial order information 86. Here, the number of remaining components of component A, component B, and component C are respectively ten, twenty, and two. Next, in step S210, the CPU 52 determines whether or not the components run out based on the number of necessary components and the number of remaining components. As shown in FIG. 5, the number of necessary components which is included in the initial order information 86 is four components A, three components B, and three components C. For this reason, for component C, the number of necessary components exceeds the number of remaining components, therefore the CPU 52 determines that the components run out. In step S230, the CPU 52 generates the modified order information 86a. In step S230, the CPU 52 moves up the orders of component C which are Order 8 to Order 10 in the initial order as in the drawings to Order 1 to Order 3 so as to be previous to any other component, and the orders of component A and component B which are Order 1 to Order 7 in the initial order moves down to Order 4 to Order 10, and generates the modified order information 86a. In the modified order information 86a, the component runs out in Order 3, and the timing (order) at which the component runs out earlier than the initial order information 86.

Here, in the initial order information 86, there is an order in which component A is mounted in as a top priority. For this reason, for example, when the number of remaining components of component A is insufficient instead of component C, even if the CPU 52 generates the modified order in step S230, the initial order and the modified order are the same. Therefore, even in a case where the CPU 52 determines that the component runs out in step S210, the CPU 52 may perform a process of step S220 in a case of the order in which the component is already preferentially mounted in the initial order. That is, in a case where it is not possible to make the timing (order) at which the component runs out earlier than the initial order, the initial order may be set to the mounting order without change.

Figure 6:
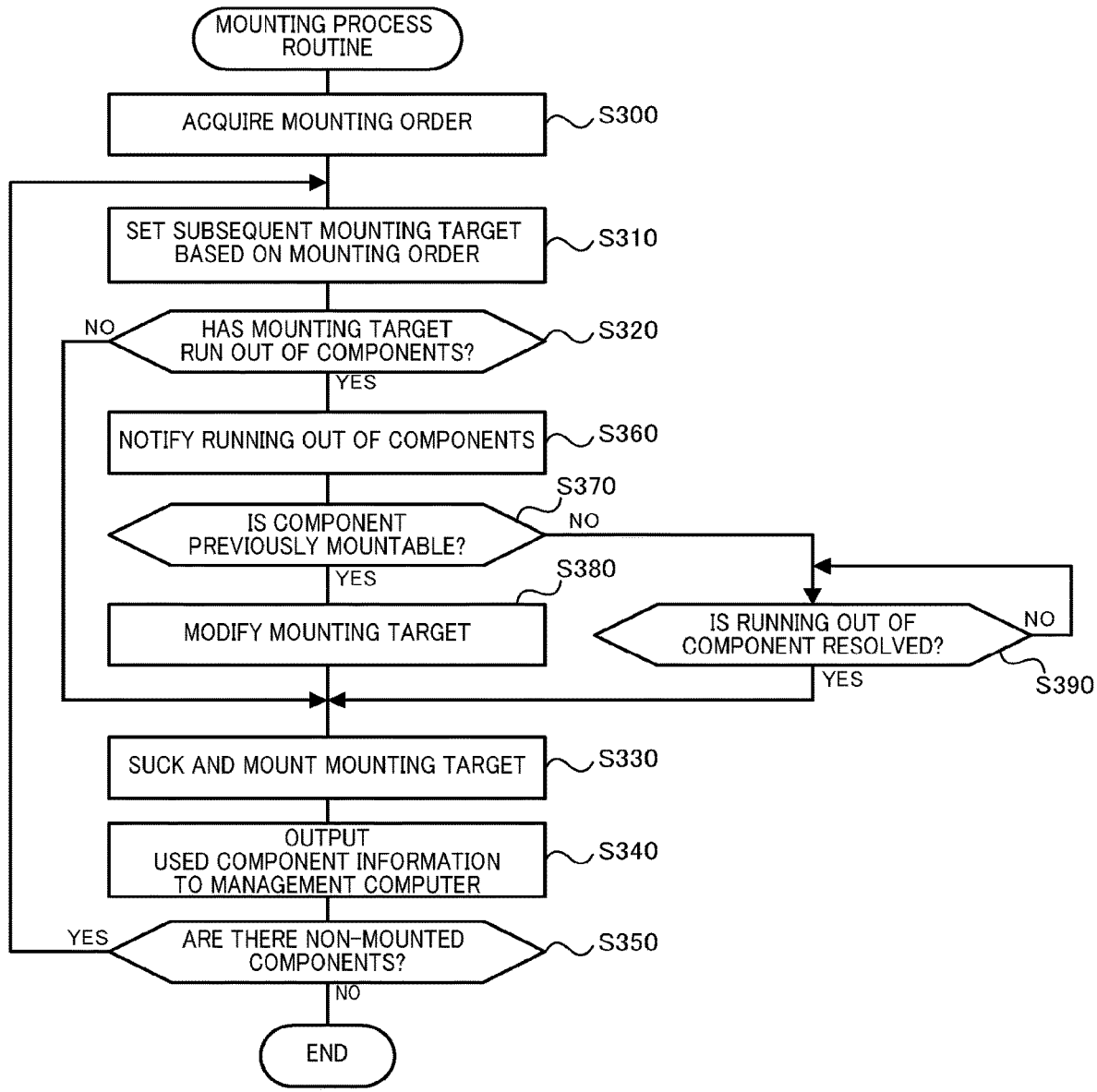
FIG. 6 is a flow chart illustrating an example of a mounting process routine.

Next, the mounting process which the mounting machine 11 performs will be described. FIG. 6 is a flow chart illustrating an example of a mounting process routine which is executed by the CPU 52 of the mounting controller 51. The routine is stored in the HDD 55 of the mounting machine 11, and is executed when the mounting order is set in the mounting order setting process described above.

When the routine is started, first, the CPU 52 of the mounting controller 51 acquires the mounting order which is set in step S220 or step S240 of the mounting setting process (step S300). The mounting order is stored in the HDD 55 as described above. Next, the CPU 52 sets the component which becomes a subsequent mounting target based on the acquired mounting order (step S310). The CPU 52 sets the component of Order 1 of the initial mounting order as a mounting target, and thereafter basically, sets the mounting target in order from Order 1 along the mounting order. Subsequently, the CPU 52 determines whether or not the component which is set as the mounting target runs out (the number of remaining components is zero) (step S320). The CPU 52 may determine whether or not there is an occurrence of running out of a component by acquiring the number of remaining components of the mounting target from the management computer 80, and may determine based on whether or not a signal is received which notifies the component running out from the feeder controller 74 of the feeder 72 to which the reel 73 that accommodates the component of the mounting target is attached. Here, the CPU 52 determines presence or absence of running out of the component, or at which point in time of the mounting order (initial order or modified order) the component runs out in the mounting order setting process. Therefore, the CPU 52 may determine whether or not the mounting target runs out of components based on whether or not the current mounting target is the component of the order which is determined to run out of components (for example, Order 3 in the generated modified order information 86a in FIG. 5) in the mounting order setting process.

In step S320, when the CPU 52 determines that the mounting target does not run out of components, the CPU 52 causes the component of the mounting target to be sucked by the suction nozzle 40, transported to the mounting position using the X-axis slider 26 and the Y-axis slider 30, and mounted to the board 16 (step S330). Then, information such as the type of component of the component which is used (mounted) is output to the management computer 80 (step S340). Here, when the management computer 80 inputs the information, the number of remaining components is updated based on the type of component and the like which is included in the input information. Then, CPU 52 determines whether or not there is a non-mounted component during the mounting order (step S350), if there is a non-mounted component, the processes of step S310 and after are executed. Here, in the present embodiment, in step S310 of second and subsequent times, the CPU 52 sets the component of the subsequent order of the mounting target which is mounted in step S330 directlybefore as the mounting target. Meanwhile, in step S350, when the CPU 52 determines that there is not any non-mounted component, that is, when the components which are included in the mounting order are all mounted, the present routine ends. In this manner, when any components which are included in the mounting order do not run out, the CPU 52 mounts the component on the board 16 in order from Order 1 according to the mounting order.

Meanwhile, in step S320, when the CPU 52 determines that the mounting target runs out of components, the CPU 52 notifies the operator of the components running out such that the component that runs out is replenished (S360). Here, for example, the CPU 52 may display an image which indicates the running out of the component on the display which is not shown in the drawings of the mounting machine 11, and the management computer 80 may display an image which indicates the running out of the component on the display 88 by the CPU 52 outputting information which indicates the running out of the components on the management computer 80. Subsequently, the CPU 52 determines whether or not there is a mountable component, that is, a component that does not run out in an order in which the mounting order is further after the component which has run out (step S370).

In step S370, when the CPU 52 determines that there is a mountable component, the CPU 52 changes the mounting target to the mountable component (step S380), and the processes of step S330 and after are performed. Here, when there are a plurality of previously mountable components, the CPU 52 sets the component that is most before the mounting order among the mountable components as the mounting target. Meanwhile, in step S370, when CPU 52 determines that there is no mountable component, the CPU 52 waits until the mounting target component is replenished and the running out of the component is resolved (step S390), when the running out of the component is resolved, the processes of step S330 and after are performed.

Here, an aspect of performing the mounting process will be described as an example of a case where the modified order information 86a which is indicated in FIG. 5 is set to the mounting order. In a case where the modified order information 86a is set in the mounting order, after the CPU 52 mounts component C of Order 1 and Order 2 in order in step S330, in the subsequent step S310, component C of Order 3 is set as the mounting target. However, since component C at this time runs out, the CPU 52 notifies the running out of component C in step S360. When the operator is notified of the running out of component C, the operator performs work in which component C is replenished by exchanging the feeder 72 having the reel 73 in which component C is accommodated. Then, since the previously mountable component A and component B are present after Order 3, the CPU 52 mounts component A by modifying the mounting target in component A of Order 4 which is the earliest in the order in step S380. Hereafter, the CPU 52 mounts the component on the board 16 by sequentially setting components of Order 5 and after as mounting targets. In this manner, in the mounting process, when the component of the mounting target runs out, the CPU 52 sets the component which is previously mountable as the mounting target and performs mounting of the component by skipping mounting of the component that has run out. For this reason, also while replenishment work of component C is performed by the operator, components other than component C are mounted in parallel. Then, when the components of Order 5 to Order 10 are mounted on the board 16, since the component C of Order 3 is not mounted, after in step S350, the CPU 52 performs the process of step S310 in which the CPU 52 sets component C of Order 3 as the mounting target. Then, if the replenishment of component C is not completed, the CPU 52 executes the processes of steps S320, S360, and S370, and since there are no other mountable components in S370, waits until the running out of the component is resolved in S390. In step S320 or step S390, if the replenishment of component C is completed, the CPU 52 executes mounting of component C of Order in step S330, determines that there are no non-mounted components in step S360, and the mounting process ends. In this manner, even on component C which runs out and for which mounting is skipped, the CPU 52 performs mounting after component C is replenished. Here, in the present embodiment, in step S310, the CPU 52 sets the component of the subsequent order to the mounting target which is mounted in step S330 directly before as the mounting target, but in step S310, may usually set the component with the earliest order out of the components which are not mounted as the mounting target.

Here, when the mounting order setting process and the mounting process described above are performed one at a time, mounting is completed based on one initial order (or a modified order which rearranges the mounting). The CPU 52 sequentially performs mounting based on a plurality of initial orders (or modified orders which rearrange the mounting) which are stored in the HDD 85 of the management computer 80 by alternately repeating the mounting order setting process and the mounting process.

Here, the correspondence relationship between configuration elements of the present embodiment and configuration elements of the present disclosure is clarified. The mounting machine 11 of the present embodiment is equivalent to the mounting machine of the present disclosure, the head 24 is equivalent to the mounting head of the present disclosure, and the mounting controller 51 is equivalent to the mounting control device and the mounting order setting device. In addition, the management computer 80 of the present embodiment is equivalent to the mounting management apparatus of the present disclosure, the management controller 81 is equivalent to the output device, and the HDD 55 is equivalent to the order memory device.

According to the component mounting system 10 which is described above, during the mounting process when a component of a subsequent mounting target in the mounting order runs out, and a component later in the mounting order does not run out, the mounting machine 11 previously mounts the component that does not run out on the board 16. By doing this, while the component that runs out is replenished, it is possible that the other components later in the mounting order is mounted in parallel, and it is possible to further suppress an increase in mounting time due to running out of components. Moreover, the mounting machine 11 acquires the mounting order (initial order or modified order) in which a component in the plurality of components that has a higher possibility of running out than another component is preferentially mounted, and performs the mounting process based on the mounting order. Due to performing the mounting process using such a mounting order, when a component runs out, a state tends to occur in which other component later in the mounting order than the component which has run out still remain. For this reason, when a component runs out, it is easy for the replenishment of the component which has run out and mounting of the other components in parallel, and it is possible to further suppress the increase in mounting time due to running out of a the component.

In addition, when the initial order is set as the mounting order in the mounting order setting process, the mounting machine 11 acquires the initial order as the mounting order in the mounting process. Then, since the initial order is set in advance as an order such that a component in the plurality of components that has a higher frequency of occurrence of running out than another component is preferentially mounted, it is possible to obtain the effect described above of further suppressing the increase of the mounting time due to running out of a component just by performing the mounting process according to the initial order. For example, in the initial order information 86 in FIG. 5, component A among component A to component C is likely to run out first, and the initial order is set such that component A is mounted as a top priority. For this reason, it is possible to obtain the effect of further suppressing the increase of the mounting time by previously mounting another component when the component runs out just by the mounting machine 11 mounting using the initial order when component A runs out. Moreover, the initial order is optimized in advance such that the time which is necessary for the mounting process is shortened in consideration of the movement distance of the head 24. For this reason, by setting the initial order as an order such that a component that has a high frequency of occurrence of running out is preferentially mounted, there is a high significance that the initial order can be set as the mounting order without the modified order being generated. For example, in the initial order information 86 in FIG. 5, in a case where the frequency of occurrence of running out of component C is high in comparison to component A and component B, since the modified order is set as the mounting order by rearranging the initial order each time component C runs out, the effect of optimizing the initial order in advance is relatively weakened (the number of times that the mounting process is performed without changing the initial order is small). Even in the initial order, the effect can be obtained by optimizing the initial order in advance by setting the order such that a component with a high frequency of occurrence of running out is preferentially mounted.

Furthermore, the mounting machine 11 determines whether or not there is an occurrence of running out of a component in the mounting process based on the number of remaining components, and when the mounting machine 11 determines that there is the component that runs out, the modified order in which the determined component is preferentially mounted is set as the mounting order. Then, when the mounting machine 11 sets the modified order as the mounting order, the mounting machine 11 acquires the set mounting order (modified order), and performs the mounting process based on the acquired mounting order. Thereby, when the component runs out, the mounting process is performed based on the mounting order in which the component is preferentially mounted, and it is possible to cause running out of the component at an earlier stage in the mounting order. For this reason, when the component runs out, it is easy for the replenishment of the component which has run out and mounting of the other component in parallel, and it is possible to further suppress the increase in mounting time due to running out of a component. For example, comparing the initial order information 86 and the modified order information 86a in FIG. 5, in the initial order, since there are no other mountable components after Order 10 in which the component runs out, the mounting machine 11 suspends the mounting process until component C is replenished. In contrast to this, in the modified order in which component C that runs out is preferentially mounted, the component runs out in Order 3 which is an earlier stage. For this reason, it is possible for the mounting machine 11 to perform mounting of Orders 4 to 10 during replenishment of component C, and it is possible to further suppress the increase of the mounting time due to running out of a component.

Here, needless to say, the present disclosure is not limited to the embodiments described above, and it is possible to execute various aspects within the technical scope of the present disclosure.

For example, in the embodiments described above, the management computer 80 stores the initial order information, but the mounting machine 11 may store the initial order information in advance.

In the embodiments described above, the CPU 52 of the mounting machine 11 performs the mounting order setting process, but the CPU 82 of the management computer 80 may perform the mounting order setting process. In this case, it is sufficient if the CPU 82 outputs the mounting order which is set in the mounting order setting process to the mounting machine 11, and in step S300 of the mounting process, the mounting machine 11 acquires the mounting order from the management computer 80. In addition, the initial order generation process is performed by the CPU 82 of the management computer 80, but may be performed by the CPU 52 of the mounting machine 11, and may be performed by another computer.

In the embodiments described above, the mounting machine 11 generates the modified order from the initial order in the mounting order setting process, but in place of generating the modified order, the preferential order in which a specific component is preferentially mounted is stored in advance in the management computer 80. For example, the initial order information 86 in FIG. 5, information which indicates the preferential order (for example, an order which is the same as the modified order information 86a) in which component C is preferentially mounted, and information which indicates the preferential order in which component B is preferentially mounted may be stored in the management computer 80. In this case, it is sufficient if the mounting machine 11 determines that there is a component that runs out in the mounting order setting process, and when the preferential order in which the component is preferentially mounted is stored in advance in the management computer 80, the preferential order may be set as the mounting order. In addition, the preferential order which is stored in advance in the management computer 80 may be optimized in advance such that the time which is necessary for the mounting process in the same manner as the initial order is shortened. Here, the initial order information and the information which indicates the preferential order may be stored in advance in the mounting machine 11.

In the embodiments described above, the initial order is set as the order such that the component the number of which the reel 73 of the feeder 72 which is mounted in the mounting machine 11 can accommodate is low is preferentially mounted, but it is sufficient if the order is such that a component that has a higher frequency of occurrence of running out than another component is preferentially mounted. For example, the initial order may be an order such that the component a large number of which are mounted on the board 16 is preferentially mounted. In addition, the initial order may be an order in which the possibility of running out of a component is not considered. Even in this case, in a case where a component runs out, as long as the mounting machine 11 generates the modified order from the initial order to set as the mounting order, it is possible to cause running out of the component at an earlier stage in the mounting order in the same manner as the embodiments described above. In a case where the initial order is an order in which the possibility that the components run out is not considered, the initial order may be set as an order that is optimized in advance such that time that is necessary for the mounting process in the case where the component does not run out is shortened in consideration of an element, (for example, movement distance of the head 24) which relates to time that is necessary for the mounting process other than running out of a component.

In the embodiments described above, when the mounting machine 11 determines that a component runs out during the initial order in step S210 of the mounting order setting process, the mounting machine 11 generates the modified order to be set as the mounting order, but is not limited thereto. For example, even in a case where a component runs out during the initial order, during the initial order, when another component which is mountable in the order after the component that runs out remains at a predetermined threshold or more, the initial order may be set without change as the mounting order. By doing so, even without changing the initial order, in a case where it is possible to mount the other component sufficiently in parallel after the mounting order while the component which had run out is replenished, it is possible to set such that the mounting order is not modified. Thereby, it is easy to obtain the effect by optimizing the initial order in advance.

In the embodiments described above, the mounting machine 11 may set the initial order which is usually acquired, omitting the mounting order setting process as the mounting order without change. Even in this case, as long as the initial order is set in advance as an order such that a component in the plurality of components that has a higher frequency of occurrence of running out than another component is preferentially mounted, when the component runs out, another component later in the mounting order than the component which runs out is likely to still remain. For this reason, it is easy for the replenishment of the component which has run out and mounting of the other component in parallel, and it is possible to further suppress the increase in mounting time due to running out of a component.

In the embodiments described above, the initial order which is indicated by the initial order information 86 is an order such that the same type of component is continuously mounted, but is not particularly limited thereto. Same applies to the modified order. However, the target components which are preferentially mounted (for example, component A in the initial order information 86 and component C in the modified order information 86a) are preferably mounted firstly continuously such that the timing (order) at which running out of the component occurs is made to be earlier. Here, since it is sufficient that the timing at which the component runs out in the modified order is earlier than the initial order, the mounting machine 11 may generate the modified order by setting the order of the component after running out the components of the target which are preferential ly mounted later than other component, or the latest of other components. For example, in the modified order information 86a, Order 3 is component C, but component C of Order 3 is determined to run out from the number of remaining components. For this reason, the mounting machine 11 may generate the modified order in which Order 1 and Order 2 are component C, Order 3 to Order 6 are component A, Order 7 to Order 9 are component B, and Order 10 is component C.

In the embodiments described above, the suction nozzle 40 of the head 24 sucks a component P, but as long as the head 24 holds the component P, the head 24 is not limited to ones by means of suction. For example, the head 24 may claw and hold the component P in a grasping section.

INDUSTRIAL APPLICABILITY

The present disclosure is utilizable in a technical field in which a component is mounted on a board.

REFERENCE SIGNS LIST

10: component mounting system, 11: mounting machine, 16: board, 18: board conveyance device, 20: supporting board, 22: conveyor belt, 24: head, 26: X-axis slider, 28: guide rail, 30: Y-axis slider, 32: guide rail, 34: Z-axis motor, 36: ball screw, 40: suction nozzle, 51: mounting controller, 52: CPU, 53: ROM, 54: RAM, 55: HDD, 70: component supply device, 71: slot, 72: feeder, 73: reel, 74: feeder controller, 80: management computer, 81: management controller, 82: CPU, 83: ROM, 84: RAM, 85: HDD, 86: initial order information, 86a: modified order information, 87: input device, 88: display

The invention claimed is:

1. A mounting machine which mounts a plurality of components on a board using a mounting head, comprising:
mounting control means configured to
acquire an initial mounting order in which a component in the plurality of components that has a higher possibility of running out than another component is preferentially mounted, the possibility of running out being based on a number of components accommodated in a reel that accommodates the respective plurality of components, and
perform a mounting process which controls the mounting head such that the components are sequentially mounted on the board based on the initial mounting order, and during the mounting process, when a first component of a subsequent mounting target in the initial mounting order runs out and a second component in the initial mounting order of which is later than the first component that has not run out, modifies the initial mounting order and controls the mounting head such that the second component that has not run out is mounted on the board.

2. The mounting machine according to claim 1, wherein the mounting control means acquires the initial mounting order which is set in advance such that a component in the plurality of components that has a comparatively smaller amount of components accommodated in the respective reel than another component is preferentially mounted.

3. The mounting machine according to claim 1, further comprising:
mounting order setting means which determines whether or not there is a component which runs out within the initial mounting order that does not consider the possibility of running out of the component based on the number of necessary components and the number of remaining components which are included in the initial order, and when it is determined that there is a component that runs out, modifies the initial mounting order in which the determined component is preferentially mounted,
wherein when the mounting order setting means sets the mounting order, the mounting control means acquires the set mounting order and performs the mounting process based on the set mounting order.

4. The mounting machine according to claim 1, further comprising:
mounting order setting means which determines whether or not there is a component that runs out in the mounting process based on the remaining number of components, and when it is determined that there is a component that runs out, modifies the initial mounting order in which the determined component is preferentially mounted,
wherein when the mounting order setting means modifies the initial mounting order, the mounting control means acquires a modified mounting order and performs the mounting process based on the modified mounting order.

5. The mounting machine according to claim 1, further comprising:

order memory means which stores a plurality of orders which include the initial mounting order and a preferential order in which a specific component is preferentially mounted; and mounting order setting means which determines whether or not there is running out of a component during the initial mounting order based on the number of necessary components and the number of remaining components which are included in the initial mounting order, and selects the preferential order when it is determined that there is running out of a component and the preferential order in which the component is preferentially mounted is stored in the order memory means, wherein when the mounting order setting means selects the preferential mounting order, the mounting control means acquires the preferential mounting order and performs the mounting process based on the preferential mounting order.

6. The mounting machine according to claim 5, wherein the initial mounting order and the preferential order are set as orders in which time is optimized in advance to be short by considering an element which relates to the time that is necessary for the mounting process.

7. A mounting management apparatus which manages a mounting order of a mounting machine that performs a mounting process in which a plurality of components are mounted on a board, the apparatus comprising:

output means configured to acquire an initial mounting order in which a component in the plurality of components that has a higher possibility of running out than another component is preferentially mounted, the possibility of running out being based on at least one of a number of components accommodated in a reel that accommodates the respective plurality of components and a number of components to be mounted on the board; and mounting order modifying means configured to determine whether or not there is a component which runs out within the initial mounting order based on the number of necessary components and the number of remaining components which are included in the initial mounting order, and when it is determined that there is a component that runs out, modify the initial mounting order to a modified mounting order in which a determined component is preferentially mounted, wherein when the mounting order modifying means modifies the initial mounting order, the output means acquires the modified mounting order and outputs the modified mounting order.

* * * * *